United States Patent
Zhang et al.

(10) Patent No.: US 11,967,970 B2
(45) Date of Patent: Apr. 23, 2024

(54) BIT-FLIPPING DECODER AND DECODING METHOD FOR IRREGULAR CODES

(71) Applicant: SK hynix Inc., Gyeonggi-do (KR)

(72) Inventors: Fan Zhang, Fremont, CA (US);
Meysam Asadi, Fremont, CA (US);
Haobo Wang, Fremont, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/944,734

(22) Filed: Sep. 14, 2022

(65) Prior Publication Data
US 2024/0088915 A1    Mar. 14, 2024

(51) Int. Cl.
*H03M 13/11*    (2006.01)
*H03M 13/15*    (2006.01)

(52) U.S. Cl.
CPC .... *H03M 13/1108* (2013.01); *H03M 13/1177* (2013.01); *H03M 13/1575* (2013.01)

(58) Field of Classification Search
CPC ................................................ H03M 13/1108
See application file for complete search history.

(56) References Cited

U.S. PATENT DOCUMENTS

| | | | |
|---|---|---|---|
| 10,574,390 B2 | 2/2020 | Vojcic et al. | |
| 11,018,695 B1 | 5/2021 | Zhang et al. | |
| 2015/0188570 A1* | 7/2015 | Kwok | H03M 13/1108 714/764 |
| 2018/0131389 A1* | 5/2018 | Xiong | G06F 3/067 |
| 2019/0097652 A1* | 3/2019 | Xiong | G06F 11/1048 |
| 2021/0143836 A1* | 5/2021 | Zhang | H04L 1/0051 |
| 2021/0175900 A1* | 6/2021 | Kuo | H03M 13/1148 |
| 2022/0190845 A1* | 6/2022 | Asadi | H03M 13/1108 |

OTHER PUBLICATIONS

Tofar C.-Y. Chang and Yu T. Su; Dynamic Weighted Bit-Flipping Decoding Algorithms for LDPC Codes; IEEE Transactions on Communications; Jan. 13, 2015 (Year: 2015).*

Junho Cho and Wonyong Sung; Adaptive Threshold Technique for Bit-Flipping Decoding of Low-Density Parity-Check Codes, IEEE Communications Letters, vol. 14, No. 9, Sep. 2010 (Year: 2010).*

* cited by examiner

*Primary Examiner* — Joseph D Torres
(74) *Attorney, Agent, or Firm* — IP & T GROUP LLP (57) ABSTRACT

A scheme for determining a flipping energy used in a bit-flipping decoder. The flipping energy is determined based on: a weight of at least one check node coupled to a column; a syndrome as a product of a noisy codeword and a parity check matrix; and a hard decision value of a previous iteration and a channel output value associated with the column.

20 Claims, 9 Drawing Sheets

```
                                                    ┌─ 1000
┌─────────────────────────────────────────────────┐
│ Determine the flipping energy based on:         │
│ a) a weight associated with a strength of at least one check │
│ node coupled to the column;                     │
│ b) a syndrome as a product of the noisy codeword and the │
│ parity check matrix; and                        │
│ c) a hard decision value of a previous iteration and a │
│ channel output value associated with the column │
└─────────────────────────────────────────────────┘
```

BIT-FLIPPING DECODER AND DECODING METHOD FOR IRREGULAR CODES

BACKGROUND

1 Field

Embodiments of the present disclosure relate to decoding schemes for a memory system.

2. DESCRIPTION OF THE RELATED ART

The computer environment paradigm has shifted to ubiquitous computing systems that can be used anytime and anywhere. As a result, the use of portable electronic devices such as mobile phones, digital cameras, and notebook computers has rapidly increased. These portable electronic devices generally use a memory system having memory device(s), that is, data storage device(s). The data storage device is used as a main memory device or an auxiliary memory device of the portable electronic devices.

Memory systems using memory devices provide excellent stability, durability, high information access speed, and low power consumption, since the memory devices have no moving parts. Examples of memory systems having such advantages include universal serial bus (USB) memory devices, memory cards having various interfaces such as a universal flash storage (UFS), and solid state drives (SSDs). Memory systems may use various types of decoders.

SUMMARY

Aspects of the present invention include a bit-flipping (BF) decoder for irregular codes and a decoding method thereof.

In one aspect of the present invention, a method of operating a bit-flipping decoder includes: receiving a noisy codeword, the codeword having been generated based on a parity check matrix of a low-density parity-check (LDPC) code and provided to a communication channel prior to reception by the bit-flipping decoder; and performing a single decoding iteration on the received noisy codeword, the single decoding iteration spanning a plurality of stages. Wherein, performing the single decoding iteration includes, for each of the plurality of stages: computing a flipping energy corresponding to a single column of the parity check matrix, flipping at least one bit in the single column upon a determination that the flipping energy exceeds a flipping threshold, computing, subsequent to the flipping, a syndrome as a product of the noisy codeword and the parity check matrix, and updating the flipping threshold upon a determination that the syndrome is not zero, wherein updating the flipping threshold for a first stage of the plurality of stages is based on a first set of rules. Wherein updating the flipping threshold for a second stage subsequent to the first stage is based on a second set of rules different from the first set of rules. Wherein the flipping threshold is updated in the middle of the single decoding iteration, Wherein the flipping energy is determined based on: a weight of at least one check node coupled to the column; a syndrome as a product of the noisy codeword and the parity check matrix; and a hard decision value of a previous iteration and a channel output value associated with the column.

In another aspect of the present invention, a decoding system includes a processor and a memory including instructions stored thereupon, Wherein the instructions upon execution by the processor cause a bit-flipping decoder to: receive a noisy codeword, the codeword having been generated based on a parity check matrix of a low-density parity-check (LDPC) code and provided to a communication channel prior to reception by the bit-flipping decoder; and perform a single decoding iteration on the received noisy codeword, the single decoding iteration spanning a plurality of stages. Wherein, performing the single decoding iteration includes, for each of the plurality of stages: computing a flipping energy corresponding to a single column of the parity check matrix, flipping at least one bit in the single column upon a determination that the flipping energy exceeds a flipping threshold, computing, subsequent to the flipping, a syndrome as a product of the noisy codeword and the parity check matrix, and updating the flipping threshold upon a determination that the syndrome is not zero, wherein updating the flipping threshold for a first stage of the plurality of stages is based on a first set of rules, Wherein updating the flipping threshold for a second stage subsequent to the first stage is based on a second set of rules different from the first set of rules. Wherein the flipping threshold is updated in the middle of the single decoding iteration, Wherein the flipping energy is determined based on: a weight of at least one check node coupled to the column; a syndrome as a product of the noisy codeword and the parity check matrix; and a hard decision value of a previous iteration and a channel output value associated with the column.

Additional aspects of the present invention will become apparent from the following description.

DETAILED DESCRIPTION

Various embodiments of the present invention are described below in more detail with reference to the accompanying drawings. The present invention may, however, be embodied in different forms and thus should not be construed as limited to the embodiments set forth herein. Rather, these embodiments are provided so that this disclosure is thorough and complete, and fully conveys the scope of the present invention to those skilled in the art. Moreover, reference herein to "an embodiment," "another embodiment," or the like is not necessarily to only one embodiment, and different references to any such phrase are not necessarily to the same embodiment(s). The term "embodiments" as used herein does not necessarily refer to all embodiments. Throughout the disclosure, like reference numerals refer to like parts in the figures and embodiments of the present invention.

The present invention can be implemented in numerous ways, including as a process; an apparatus; a system; a computer program product embodied on a computer-readable storage medium; and/or a processor, such as a processor suitable for executing instructions stored on and/or provided by a memory coupled to the processor. In this specification, these implementations, or any other form that the present invention may take, may be referred to as techniques. In general, the order of the operations of disclosed processes may be altered within the scope of the present invention. Unless stated otherwise, a component such as a processor or a memory described as being suitable for performing a task may be implemented as a general component that is temporarily configured to perform the task at a given time or a specific component that is manufactured to perform the task. As used herein, the term 'processor' or the like refers to one or more devices, circuits, and/or processing cores suitable for processing data, such as computer program instructions.

The methods, processes, and/or operations described herein may be performed by code or instructions to be executed by a computer, processor, controller, or other signal processing device. The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing methods herein.

When implemented at least partially in software, the controllers, processors, devices, modules, units, multiplexers, generators, logic, interfaces, decoders, drivers, generators and other signal generating and signal processing features may include, for example, a memory or other storage device for storing code or instructions to be executed, for example, by a computer, processor, microprocessor, controller, or other signal processing device.

A detailed description of embodiments of the present invention is provided below along with accompanying figures that illustrate aspects of the present invention. The present invention is described in connection with such embodiments, but the present invention is not limited to any embodiment. The scope of the present invention is limited only by the claims. The present invention encompasses numerous alternatives, modifications and equivalents within the scope of the claims. Numerous specific details are set forth in the following description in order to provide a thorough understanding of the present invention. These details are provided for the purpose of example; the present invention may be practiced according to the claims without some or all of these specific details. For clarity, technical material that is known in technical fields related to the present invention has not been described in detail so that the present invention is not unnecessarily obscured.

Figure 1:
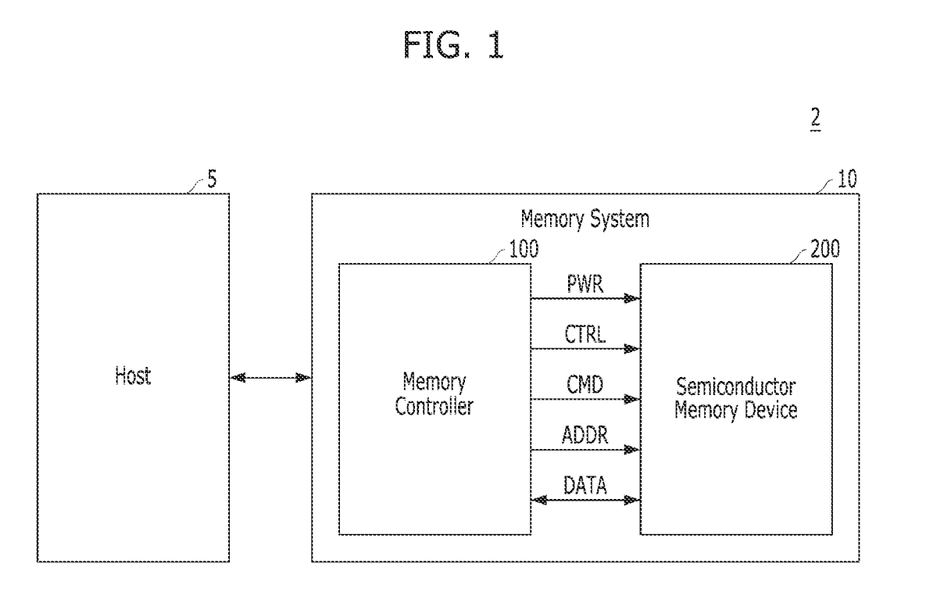
FIG. 1 is a block diagram illustrating a data processing system in accordance with an embodiment of the present invention.

FIG. 1 is a block diagram illustrating a data processing system 2 in accordance with an embodiment of the present invention.

Referring FIG. 1, the data processing system 2 may include a host device 5 and a memory system 10. The memory system 10 may receive a request from the host device 5 and operate in response to the received request. For example, the memory system 10 may store data to be accessed by the host device 5.

The host device 5 may be implemented with any of various types of electronic devices. In various embodiments, the host device 5 may include an electronic device such as a desktop computer, a workstation, a three-dimensional (3D) television, a smart television, a digital audio recorder, a digital audio player, a digital picture recorder, a digital picture player, and/or a digital video recorder and a digital video player. In various embodiments, the host device 5 may include a portable electronic device such as a mobile phone, a smart phone, an e-book, an MP3 player, a portable multimedia player (PMP), and/or a portable game player.

The memory system 10 may be implemented with any of various types of storage devices such as a solid state drive (SSD) and a memory card. In various embodiments, the memory system 10 may be provided as one of various components in an electronic device such as a computer, an ultra-mobile personal computer (PC) (UMPC), a workstation, a net-book computer, a personal digital assistant (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, a radio-frequency identification (RFID) device, as well as one of various electronic devices of a home network, one of various electronic devices of a computer network, one of electronic devices of a telematics network, or one of various components of a computing system.

The memory system 10 may include a memory controller 100 and a semiconductor memory device 200. The memory controller 100 may control overall operations of the semiconductor memory device 200.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal CTRL may include a command latch enable signal, an address latch enable signal, a chip enable signal, a write enable signal, a read enable signal, as well as other operational signals depending on design and configuration of the memory system 10.

The memory controller 100 and the semiconductor memory device 200 may be integrated in a single semiconductor device such as a solid state drive (SSD). The SSD may include a storage device for storing data therein. When the semiconductor memory system 10 is used in an SSD, operation speed of a host device (e.g., host device 5 of FIG. 1) coupled to the memory system 10 may remarkably improve.

The memory controller 100 and the semiconductor memory device 200 may be integrated in a single semiconductor device such as a memory card. For example, the memory controller 100 and the semiconductor memory device 200 may be integrated to configure a personal computer (PC) card of personal computer memory card international association (PCMCIA), a compact flash (CF) card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and/or a universal flash storage (UFS).

Figure 2:
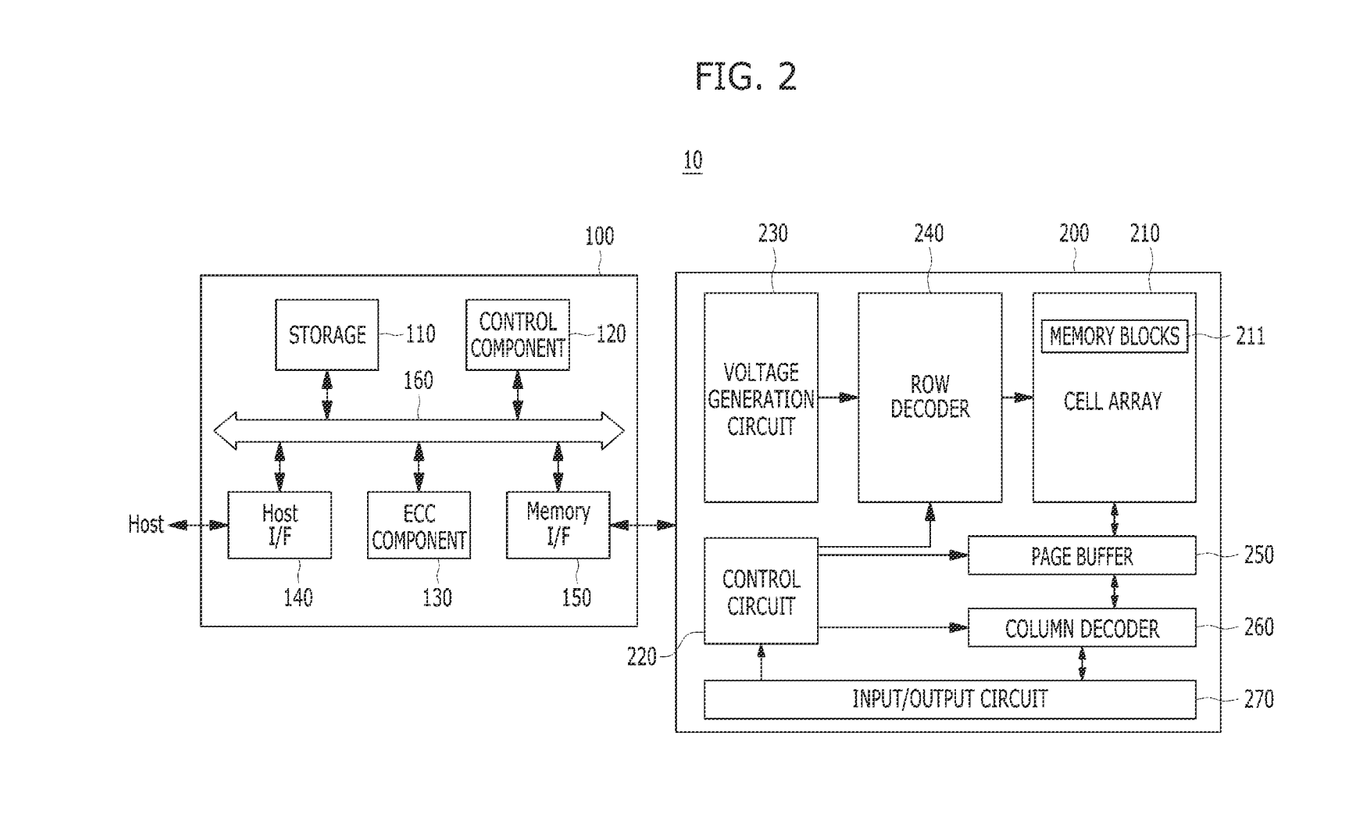
FIG. 2 is a block diagram illustrating a memory system in accordance with an embodiment of the present invention.

FIG. 2 is a block diagram illustrating a memory system in accordance with an embodiment of the present invention. For example, the memory system of FIG. 2 may depict the memory system 10 shown in FIG. 1.

Referring to FIG. 2, the memory system 10 may include a memory controller 100 and a semiconductor memory device 200. The memory system 10 may operate in response to a request from a host device (e.g., host device 5 of FIG. 1), and in particular, store data to be accessed by the host device.

The memory device 200 may store data to be accessed by the host device.

The memory device 200 may be implemented with a volatile memory device such as a dynamic random access memory (DRAM) and/or a static random access memory (SRAM) or a non-volatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magnetoresistive RAM (MRAM), and/or a resistive RAM (RRAM).

The controller 100 may control storage of data in the memory device 200. For example, the controller 100 may control the memory device 200 in response to a request from the host device. The controller 100 may provide data read from the memory device 200 to the host device, and may store data provided from the host device into the memory device 200.

The controller 100 may include a storage 110, a control component 120 which may be implemented as a processor such as a central processing unit (CPU), an error correction code (ECC) component 130, a host interface (If F) 140 and a memory interface 150, which are coupled through a bus 160.

The storage 110 may serve as a working memory of the memory system 10 and the controller 100, and store data for driving the memory system 10 and the controller 100. When the controller 100 controls operations of the memory device 200, the storage 110 may store data used by the controller 100 and the memory device 200 for such operations as read, write, program and erase operations.

The storage 110 may be implemented with a volatile memory such as a static random access memory (SRAM) or a dynamic random access memory (DRAM). As described above, the storage 110 may store data used by the host device in the memory device 200 for the read and write operations. To store the data, the storage 110 may include a program memory, a data memory, a write buffer, a read buffer, a map buffer, and the like.

The control component 120 may control general operations of the memory system 10, and a write operation or a read operation for the memory device 200 in response to a write request or a read request from the host device. The control component 120 may drive firmware, which is referred to as a flash translation layer (FTL), to control general operations of the memory system 10. For example, the FTL may perform operations such as logical-to-physical (L2P) mapping, wear leveling, garbage collection, and/or bad block handling. The L2P mapping is known as logical block addressing (LBA).

The ECC component 130 may detect and correct errors in the data read from the memory device 200 during the read operation. The ECC component 130 may not correct error bits when the number of the error bits is greater than or equal to a threshold number of correctable error bits, and instead may output an error correction fail signal indicating failure in correcting the error bits.

In various embodiments, the ECC component 130 may perform an error correction operation based on a coded modulation such as a low density parity check (LDPC) code, a Bose-Chaudhuri-Hocquenghem (BCH) code, a turbo code, a turbo product code (TPC), a Reed-Solomon (RS) code, a convolution code, a recursive systematic code (RSC), a trellis-coded modulation (TCM), or a Block coded modulation (BCM). However, error correction is not limited to these techniques. As such, the ECC component 130 may include any and all circuits, systems or devices for suitable error correction operation.

The host interface 140 may communicate with the host device through one or more of various communication standards or interfaces such as a universal serial bus (USB), a multi-media card (MMC), a peripheral component interconnect express (PCI-e or PCIe), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The memory interface 150 may provide an interface between the controller 100 and the memory device 200 to allow the controller 100 to control the memory device 200 in response to a request from the host device. The memory interface 150 may generate control signals for the memory device 200 and process data under the control of the control component 120. When the memory device 200 is a flash memory such as a NAND flash memory, the memory interface 150 may generate control signals for the memory and process data under the control of the control component 120.

The memory device 200 may include a memory cell array 210, a control circuit 220, a voltage generation circuit 230, a row decoder 240, a page buffer 250 which may be in the form of an array of page buffers, a column decoder 260, and an input and output (input/output) circuit 270, The memory cell array 210 may include a plurality of memory blocks 211 which may store data. The voltage generation circuit 230, the row decoder 240, the page buffer array 250, the column decoder 260 and the input/output circuit 270 may form a peripheral circuit for the memory cell array 210. The peripheral circuit may perform a program, read, or erase operation of the memory cell array 210. The control circuit 220 may control the peripheral circuit.

The voltage generation circuit 230 may generate operation voltages of various levels. For example, in an erase operation, the voltage generation circuit 230 may generate operation voltages of various levels such as an erase voltage and a pass voltage.

The row decoder 240 may be in electrical communication with the voltage generation circuit 230, and the plurality of memory blocks 211. The row decoder 240 may select at least one memory block among the plurality of memory blocks 211 in response to a row address generated by the control circuit 220, and transmit operation voltages supplied from the voltage generation circuit 230 to the selected memory blocks.

Figure 3:
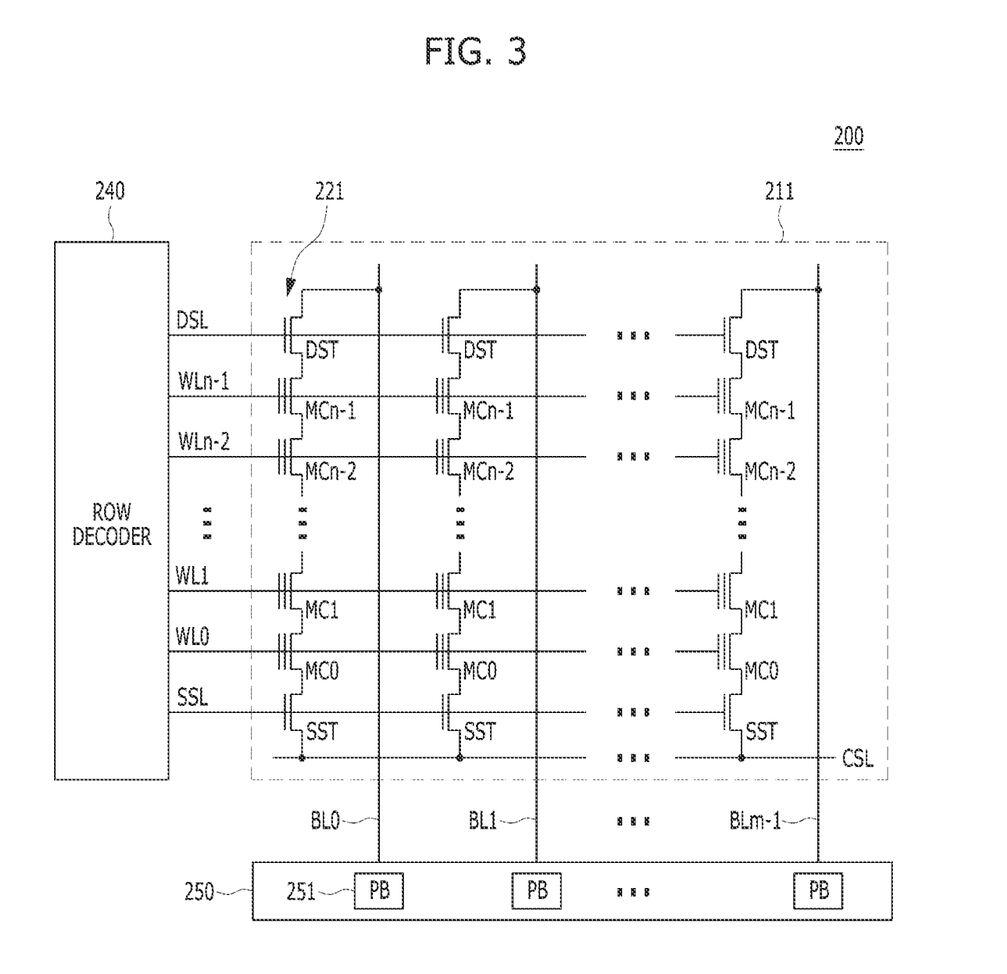
FIG. 3 is a circuit diagram illustrating a memory block of a memory device in accordance with an embodiment of the present invention.

The page buffer 250 may be coupled with the memory cell array 210 through bit lines BL (shown in FIG. 3). The page buffer 250 may precharge the bit lines BL with a positive voltage, transmit data to and receive data from, a selected memory block in program and read operations, or temporarily store transmitted data in response to page buffer control signal(s) generated by the control circuit 220.

The column decoder 260 may transmit data to and receive data from, the page buffer 250 or transmit and receive data to and from the input/output circuit 270.

The input/output circuit 270 may transmit to the control circuit 220 a command and an address, received from an external device (e.g., the memory controller 100 of FIG. 1), transmit data from the external device to the column decoder 260, or output data from the column decoder 260 to the external device, through the input/output circuit 270.

The control circuit 220 may control the peripheral circuit in response to the command and the address, FIG. 3 is a circuit diagram illustrating a memory block of a semiconductor memory device in accordance with an embodiment of the present invention. For example, the memory block of FIG. 3 may be any of the memory blocks 211 of the memory cell array 210 shown in FIG. 2.

Referring to FIG. 3, the memory block 211 may include a plurality of word lines WL0 to WLn-1, a drain select line DSL and a source select line SSL coupled to the row decoder 240. These lines may be arranged in parallel, with the plurality of word lines between the DSL and SSL.

The memory block 211 may further include a plurality of cell strings 221 respectively coupled to bit lines BL0 to BLm-1. The cell string of each column may include one or more drain selection transistors DST and one or more source selection transistors SST. In the illustrated embodiment, each cell string has one DST and one SST. In a cell string, a plurality of memory cells or memory cell transistors MC0 to MCn-1 may be serially coupled between the selection transistors DST and SST. Each of the memory cells may be formed as a multiple level cell. For example, each of the memory cells may be formed as a single level cell (SLC) storing 1 bit of data. Each of the mea gory cells may be formed as a mufti-level cell (MLC) storing 2 bits of data. Each of the memory cells lay be formed as a triple-level cell (TLC) storing 3 bits of data. Each of the memory cells may be formed as a quadruple-level cell (QLC) storing 4 bits of data.

The source of the SST in each cell string may be coupled to a common source line CSL, and the drain of each DST may be coupled to the corresponding bit line. Gates of the SSTs in the cell strings may be coupled to the SSL, and gates of the DSTs in the cell strings may be coupled to the DSL. Gates of the memory cells across the cell strings may be coupled to respective word lines. That is, the gates of memory cells MC0 are coupled to corresponding word line WL0, the gates of memory cells MC1 are coupled to corresponding word line WL1, etc. The group of memory cells coupled to a particular word lane may be referred to as a physical page. Therefore, the number of physical pages in the memory block 211 may correspond to the number of word lines.

The page buffer array 250 may include a plurality of page buffers 251 that are coupled to the bit lines BL0 to BLm-1, The page buffers 251 may operate in response to page buffer control signals. For example, the page buffers 251 may temporarily store data received through the bit lines BL0 to BLm-1 or sense voltages or currents of the bit lines during a read or verify operation.

In some embodiments, the memory blocks 211 may include a NAND-type flash memory cell. However, the memory blocks 211 are not limited to such cell type, but may include NOR-type flash memory cell(s). Memory cell array 210 may be implemented as a hybrid flash memory in which two or more types of memory cells are combined, or one-NAND flash memory in which a controller is embedded inside a memory chip.

Figure 4:
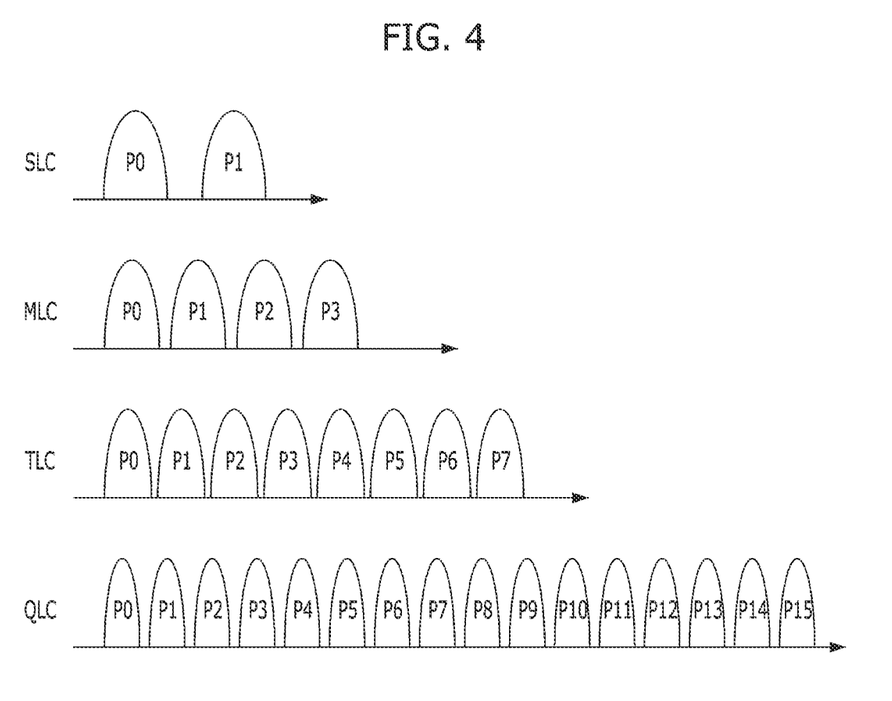
FIG. 4 is a diagram illustrating distributions of states for different types of cells of a memory device in accordance with an embodiment of the present invention.

FIG. 4 is a diagram illustrating distributions of states or program voltage (PV) levels for different types of cells of a memory device in accordance with an embodiment of the present invention.

Referring to FIG. 4, each of memory cells may be implemented with a specific type of cell, for example, a single level cell (SLC) storing 1 bit of data, a multi-level cell (MLC) storing 2 bits of data, a triple-level cell (TLC) storing 3 bits of data, or a quadruple-level cell (CLC) storing 4 bits of data. Usually, all memory cells in a particular memory device are of the same type, but that is not a requirement.

An SLC may include two states P0 and P1. P0 may indicate an erase state, and P1 may indicate a program state. Since the SLC can be set in one of two different states, each SLC may program or store 1 bit according to a set coding method. An MLC lay include four states P0, P1, P2 and P3. Among these states, P0 may indicate an erase state, and P1 to P3 may indicate program states. Since the MLC can be set in one of four different states, each MLC may program or store two bits according to a set coding method. A TLC may include eight states P0 to P7, Among these states, P0 may indicate an erase state, and P1 to P7 may indicate program states. Since the TLC can be set in one of eight different states, each TLC may program or store three bits according to a set coding method. A QLC may include 16 states PU to P15, Among these states, PU may indicate an erase state, and P1 to P15 may indicate program states. Since the QLC can be set in one of sixteen different states, each QLC may program or store four bits according to a set coding method.

Referring back to FIGS. 2 and 3, the memory device 200 may include a plurality of memory cells (e.g., NAND flash memory cells), The memory cells are arranged in an array of rows and columns as shown in FIG. 3. The cells in each row are connected to a word line (e.g., WL0), while the cells in each column are coupled to a bit line (e.g., BL0). These word and bit lines are used for read and write operations. During a write operation, the data to be written ('1' or 'U') is provided at the bit line while the word line is asserted. During a read operation, the word line is again asserted, and the threshold voltage of each cell can then be acquired from the bit line, Multiple pages may share the memory cells that belong to (i.e., are coupled to) the sane word line. When the memory cells are implemented with MLCs, the multiple pages include a most significant bit (MSB) page and a least significant bit (LSB) page. When the memory cells are implemented with TLCs, the multiple pages include an MSB page, a center significant bit (CSB) page and an LSB page. When the memory cells are implemented with QLCs, the multiple pages include an MSB page, a center most significant bit (CMSB) page, a center least significant bit (CLSB) page and an LSB page. The memory cells may be programmed using a coding scheme (e.g., Gray coding) in order to increase the capacity of the memory system 10 such as SSD.

Figure 5A:
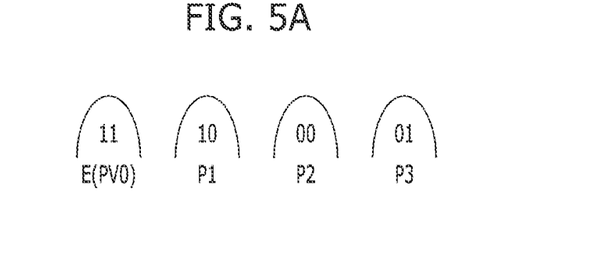
FIG. 5A is a diagram illustrating an example of Gray coding for a multi-level cell (MLC) in accordance with an embodiment of the present invention.

FIG. 5A is a diagram illustrating an example of coding for a multi-level cell (MLC) in accordance with an embodiment of the present invention.

Referring to FIG. 5A, an MLC may be programmed using a set type of coding. An MLC may have 4 program states, which include an erased state E (or PV0) and a first program state PV1 to a third program state PV3, The erased state E (or PV0) may correspond to "11." The first program state PV1 may correspond to "10." The second program state PV2 may correspond to "00." The third program state PV3 may correspond to "01."

Figure 5B:
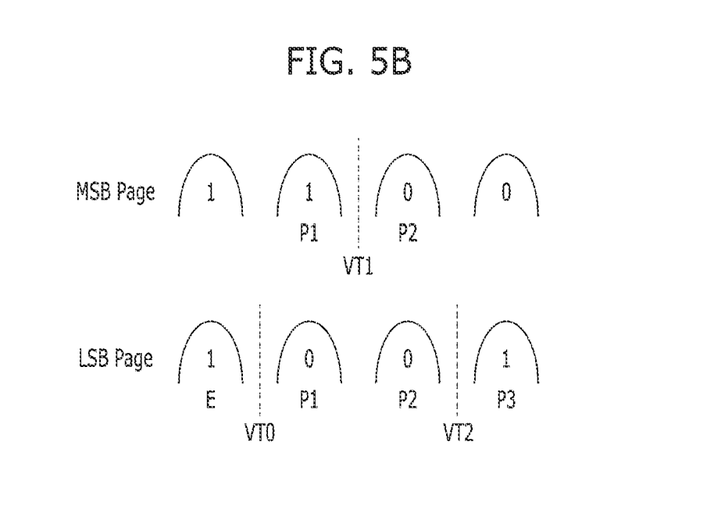
FIG. 5B is a diagram illustrating state distributions for pages of a multi-level cell (MLC) in accordance with an embodiment of the present invention.

In the MLC, as shown in FIG. 5B, there are 2 types of pages including LSB and MSB pages. 1 or 2 thresholds may be applied in order to retrieve data from the MLC. For an MSB page, the single threshold value is VT1. VT1 distinguishes between the first program state PV1 and the second program state PV2. For an LSB page, 2 thresholds include a threshold value VT0 and a threshold value VT2. VT0 distinguishes between the erased state E and the first program state PV1. VT2 distinguishes between the second program state PV2 and the third program state PV3.

Figure 6:
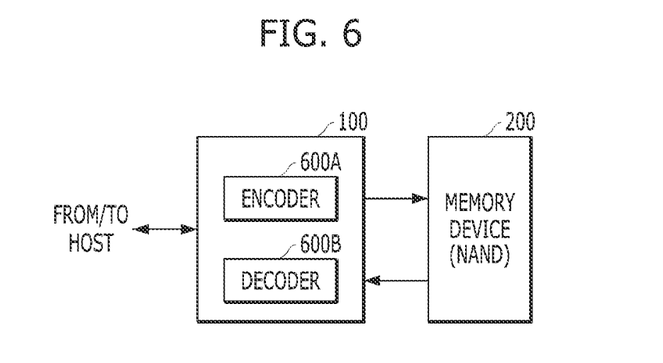
FIG. 6 is a diagram illustrating a memory system in accordance with an embodiment of the present invention.

FIG. 6 is a diagram illustrating a memory system in accordance with an embodiment of the present invention.

Referring to FIG. 6, the memory system may include a controller 100 and a memory device 200. The memory device 200 may include a NAND-type flash memory device with memory cells such as single-level cells (SLCs), multi-level cells (WILCO, triple-level cells (TLCs) or quadruple-level cells (QLCs). In various embodiments, the memory device 200 may include a NAND-type flash memory device with QLC memory cells (i.e., QLCs).

The controller 100 may receive a command from a host, and provide the memory device 200 with the received command. For example, the controller 100 receives a write command and write data corresponding to the write command, and controls the memory device 200 to perform a program operation on the write data. For another example, the controller 100 receives a read command, and controls the memory device 200 to perform a read operation on data corresponding to the read command. The controller 100 transmits read data corresponding to the read command to the host.

The controller 100 may include an encoder 600A, and a decoder 600B. During the program operation, the encoder 600A may perform an encoding operation on the write data based on a set encoding scheme. During the read operation, the decoder 600B may perform a decoding operation on the read data based on a set decoding scheme corresponding to the encoding scheme. The controller 100 may include a processor (e.g., the control component 120 of FIG. 2) and a memory (e.g., the storage 110 of FIG. 2) including instructions stored thereupon, wherein the instructions upon execution by the processor cause the decoder 600B to perform the decoding operation. The controller 100 and the memory device 200 may include various other components as shown in FIG. 2 and perform the operations described in FIGS. 1 and 2. In an embodiment, the encoder 600A and decoder 600B may be embodied in the ECC component 130 of the controller 100 shown in FIG. 2, Other suitable arrangements may be employed as well, as described below. In general, the encoder 600A and decoder 600B may be implemented by hardware, software, firmware, or any suitable combination thereof.

Implementations of a memory system may include a bit-flipping (BF) decoder and/or a min-sum (MS) decoder. The BF decoder has smaller gate counts (i.e., less area), consumes less power but has weaker error correction capability (i.e., lower precision). The MS decoder has higher gate counts, consumes higher power and can correct more errors than the BF decoder (i.e., higher precision). One implementation of a BF decoder will be described with reference to FIGS. 7 to 9A, which are described in U.S. Pat. No. 11,018,695 entitled "FAST-CONVERGING BIT-FLIPPING DECODER FOR LOW-DENSITY PARITY-CHECK CODES" and incorporated by reference herein in its entirety.

Figure 7:
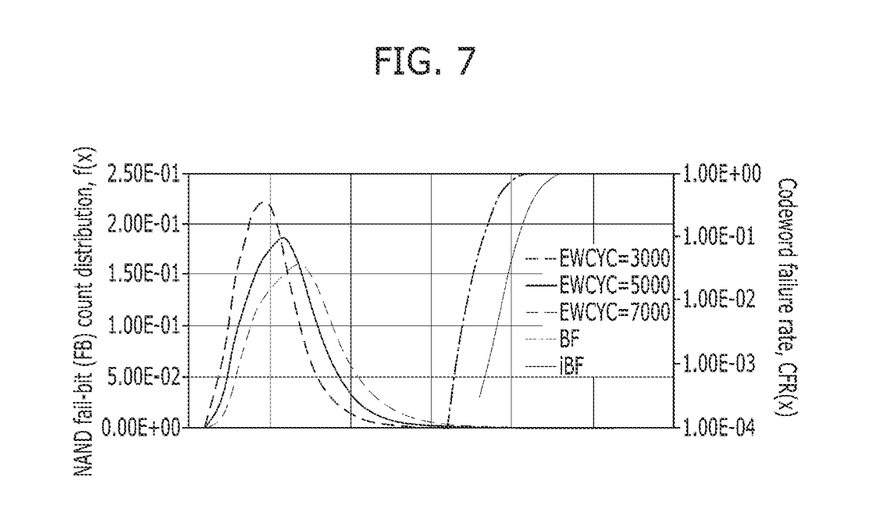
FIG. 7 is a performance plot illustrating the fail-bit (FB) distribution and codeword failure rate (CFR) of a bit-flipping decoder in an exemplary NAND device.

FIG. 7 is a performance plot illustrating the fail-bit (FB) distribution and codeword failure rate (CFR) of a bit-flipping decoder in an exemplary NAND device (e.g., the NAND device described in the context of FIGS. 1-6). FIG. 7 illustrates NAND fail-bit (FB) count distributions on the left-hand y-axis for different values of erase/write cycles (e.g., EWCYC=3000, 5000 and 7000), and the codeword failure rate for a bit-flipping decoder (denoted "BF") and an improved bit-flipping decoder (denoted "iBF") on the right-hand y-axis. In an example, the iBF decoder a version of the BF decoder in which the energy function (or flipping energy or indicator) is based on channel information; e.g., whether the current hard decision is different from a hard decision corresponding to the received bit or not.

As illustrated in FIG. 7, orders of magnitude of reduction in the CFR of a bit-flipping decoder only translates to a tiny traffic reduction to the min-sum hard (MSH) decoder. This is because a majority of the traffic, even at end-of-life (EOL) conditions, have low FB counts. Only a small percentage of the traffic will have a FB count that is close to the waterfall point of the bit-flipping decoder's CFR curve. Thus, embodiments of the disclosed technology focus on, amongst other features and benefits, optimizing or improving the operations of the bit-flipping decoder to handle the majority of traffic, which is characterized by a low FB count. As discussed earlier, this optimization results in an increased decoder throughput and lower power consumption requirements.

An exemplary operation of the bit-flipping decoder assumes that $x=[x_0, x_1, \ldots, x_{N-1}]$ is a bit vector and $H=[h_{ij}]$ is an M×N low-density parry-check matrix with a binary value $h_{ij}$ at row j and column i, and with each row of H providing a parity check for x. If x is a codeword of H, then $xH^T=0$. It is further assumed that x is transmitted over a noisy channel and that the output of the channel is $y=[y_0, y_1, \ldots, y_{N-1}]$, which is processed by the receiver. The parity-check matrix of an LDPC code can be represented by a bipartite graph called a Tanner graph that is composed of two groups of nodes: checks nodes and variable nodes.

In an example, the receiver computes the syndrome of y as a binary vector calculated as $s=[s_0, s_1, \ldots, s_{N-1}]=yH^T$, with the weight of s (denoted $\|s\|$ and equivalent to the number of "1" entries in s) representing the number of unsatisfied check nodes. Furthermore, the number of unsatisfied check nodes connected with variable node j is denoted $\|s_j\|$.

An example algorithm for improving convergence of a bit-flipping decoder, according to embodiments of the disclosed technology, assumes E(i) is the flipping energy (or indicator) of the i-th column, T is the flipping threshold, s is the syndrome, t is the iteration index (or number) such that ($0 \leq t \leq t_{max}$), $d_i^{(t)}$ denotes the decision of variable node i of the t-th iteration, and $$d^{(t)} = [d_0^{(t)}, d_1^{(t)}, \ldots, d_{N-1}^{(t)}]; s^{(t)} = [d_0^{(t)}, d_1^{(t)}, \ldots, d_{N-1}^{(t)}] H^T.$$

Lastly, it is assumed that $d^{(-1)} = [d_0^{(-1)}, d_1^{(-1)}, \ldots, d_{N-1}^{(-1)}] = y$, then $s^{(-1)} = yH^T$.

In some embodiments, the iterative decoding algorithm is described as follows:

Operation 0: Set t=0, calculate $s^{(-1)}$ and go to Operation 1;

Operation 1: If max iteration exceeded, stop decoding. Else, go to Operation 2;

Operation 2: If s=0, stop decoding. Otherwise, go to Operation 3;

Operation 3: For all of the variable nodes, perform the following operations:
update the flipping indicator (or energy), E(i);
update the flipping threshold, T;
flip the i-th bit if E(i)>T;
compute and update s; and
go to Operation 1.

In some embodiments, the flipping indicator E is updated as follows:

if $d_i^{(t)} = y_i$, then $E(i) = \|s_i\|$, otherwise, $E(i) = \|s_i\| + \alpha$.

Herein, $\alpha$ can be any positive value. For example, if $\alpha$ is set to 1, $E(i) = \|s_i\| + 1$ when $d_i^{(t)} \neq y_i$.

In some embodiments, the adaptive flipping threshold T is generated based on the iteration number, the number of unsatisfied check nodes of the previous iteration, and/or the number of variable nodes flipped in the previous iteration. In an example of a finite state machine (FSM) that can be used to adaptively update the flipping threshold, the following computations are performed:

if (t==0) and ($\|s\| < \beta_1$), then $T = \delta_1$;
else if (t==0), then $T = \delta_1 - 1$;
else if (t==1), then $T = \delta_1$;
else if (p==0), then $T = T - 1$
else if (t>$\epsilon$) and ($\|s\| < \beta_2$), then $T = \delta_2$;
else if ($\|s\| < \beta_3$) and (p>$\theta_1$) and (T+1)<$\delta_3$, then $T = T+1$;
else if ($\|s\| < \beta_3$) and (p<$\theta_1$), then $T = \delta_3$;
else if (p$\leq \theta_2$) and ($\|s\| > \beta_3$), then $T = \max(\delta_4, T-1)$;
else T=T.

Herein, $\beta_1$, $\beta_2$, $\beta_3$, $\delta_1$, $\delta_2$, $\delta_3$, $\delta_4$, $\theta_1$, $\theta_2$ and $\epsilon$ are parameters that are predetermined or that can be configured adaptively. In an example, $\beta_1 = 50$, $\beta_2 = 20$, $\theta_3 = 9999$, $\delta_1 = 5$, $\delta_2 = 4$, $\delta_3 = 5$, $\delta_4 = 3$, $\theta_1 = 10$, $\theta_2 = 10$, and $\epsilon = 10$. In another example, these parameters may be optimized to maximize the throughput of the bit-flipping decoder.

In some embodiments, the error correction mechanism flips a single bit. In other embodiments, errors are corrected by flipping multiple bits.

Figure 8:
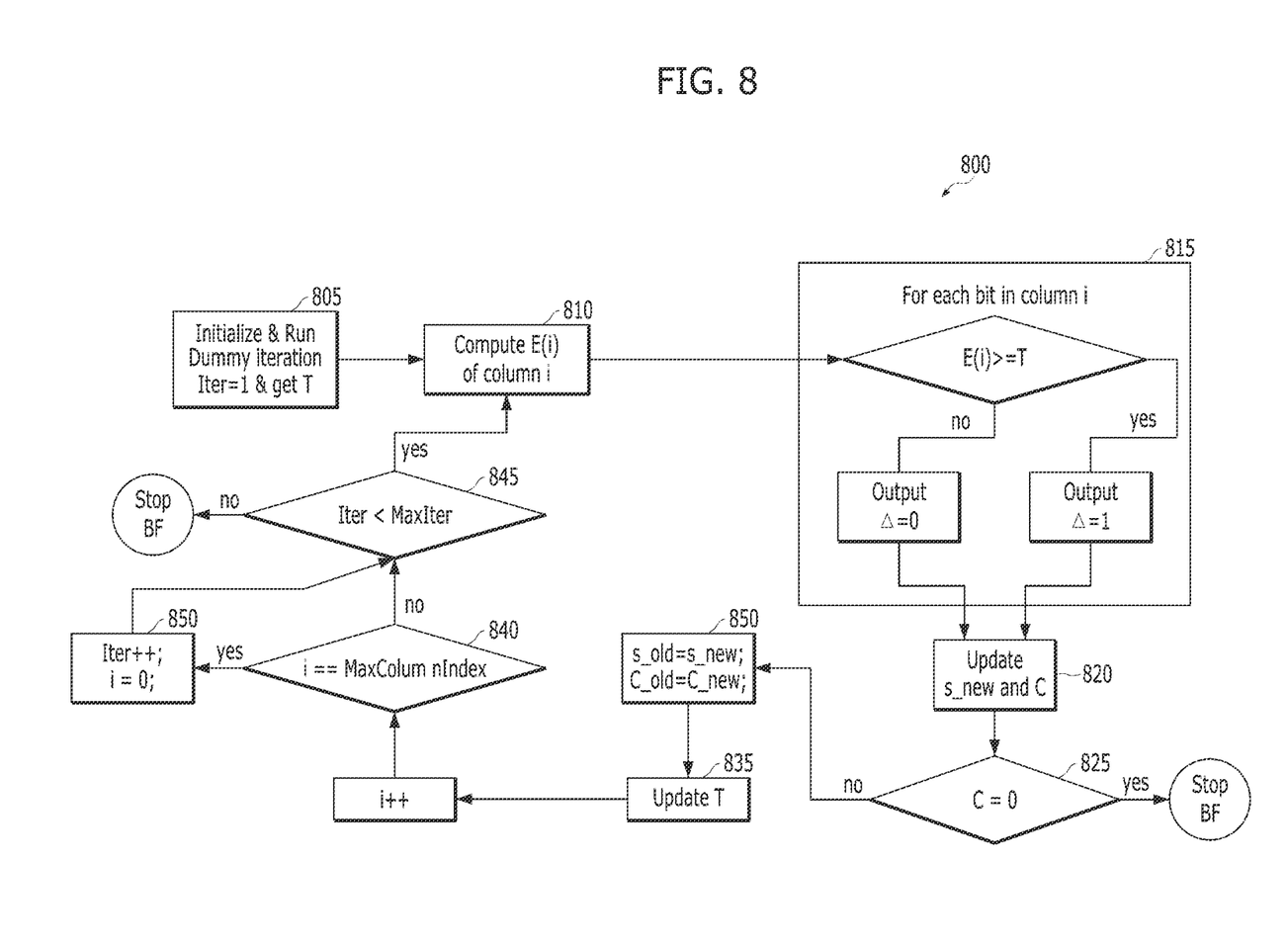
FIG. 8 illustrates a flowchart of an example method for improving convergence of a bit-flipping decoder.

FIG. 8 illustrates a flowchart of an example method for improving the convergence of a bit-flipping decoder. Maintaining the notation of the previously described example, the method 800 begins with initializing the decoder at 805 (e.g., by running a dummy iteration) to generate the bit-flipping threshold T. Similar to Operation 3 in the above description, the flipping energy for the i-th column E(i) is computed at 810, and compared to the bit-flipping threshold at 815, which results in either a bit being flipped ($\Delta = 1$ if $E(i) \geq T$) or a bit not being flipped ($\Delta = 0$ if $E(i) < T$).

The conditional bit-flipping is followed by recomputing the syndrome (s_new) and the checksum value (C) at 820. If the checksum value is equal to zero (operation 825), then the bit-flipping decoder is stopped since the received codeword has been correctly decoded. If the checksum is not equal to zero, then the syndrome and checksum values are updated at 830, and the threshold is updated at 835. In an example, the threshold is updated based on the iteration number, the number of unsatisfied check nodes of the previous iteration, and/or the number of variable nodes flipped in the previous iteration, as described above.

Figure 9A:
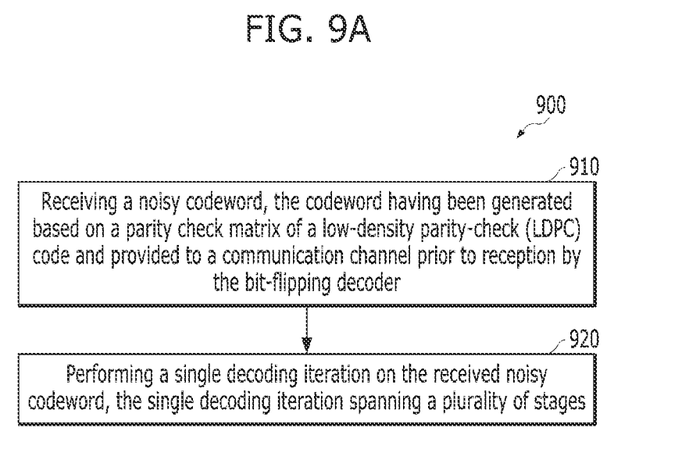
FIG. 9A illustrates a flowchart of another example method for improving convergence of a bit-flipping decoder.

The column index (i) is iterated, whether the last column was processed is determined at 840, If all columns have been processed, then the iteration index is incremented and the next iteration is initialized at 850. If the iteration index has exceeded the maximum number of iterations at 845, then the bit-flipping decoder is stopped. Otherwise, control returns to operation 810 where the flipping energy for the (i+1)-th column E(i+1) is computed, FIG. 9A illustrates a flowchart of an example method 900 for improving convergence of a bit-flipping decoder. The method 900 includes, at operation 910, receiving a noisy codeword, the codeword having been generated based on a parity check matrix of a low-density parity-check (LDPC) code and provided to a communication channel prior to reception by the bit-flipping decoder.

The method 900 includes, at operation 920, performing a single decoding iteration on the received noisy codeword, the single decoding iteration spanning a plurality of stages.

Figure 9B:
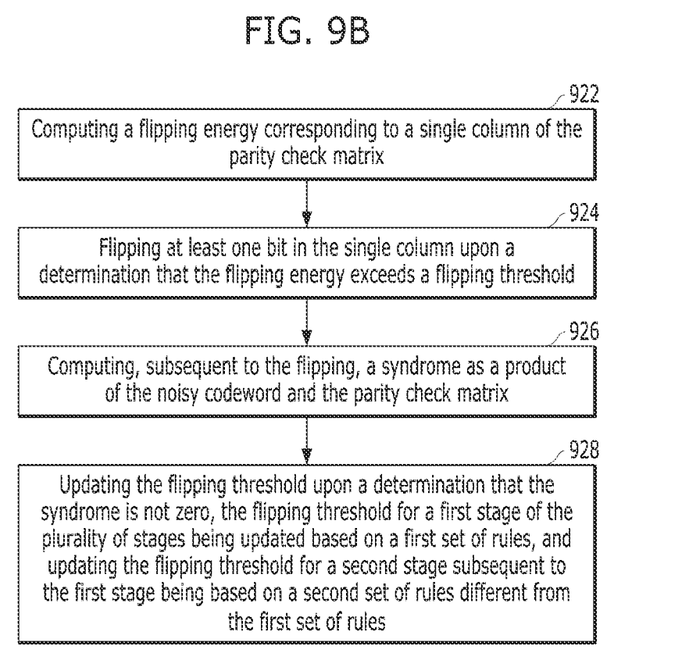
FIG. 9B illustrates a flowchart of an yet another example method for improving convergence of a bit-flipping decoder.

FIG. 9B illustrates a flowchart related to operation 920 of FIG. 9A. In some embodiments, performing the single decoding iteration includes, for each of the plurality of stages, computing a flipping energy corresponding to a single column of the parity check matrix (922).

Operation 920 includes flipping at least one bit in the single column upon a determination that the flipping energy exceeds a flipping threshold (924).

Operation 920 includes computing, subsequent to the flipping, a syndrome as a product of the noisy codeword and the parity check matrix (926).

Operation 920 includes updating the flipping threshold upon a determination that the syndrome is not zero, the flipping threshold for a first stage of the plurality of stages being updated based on a first set of rules, and updating the flipping threshold for a second stage subsequent to the first stage being based on a second set of rules different from the first set of rules (928).

In some embodiments, updating the flipping threshold is based on an index of the decoding iteration, a number of non-zero values in the syndrome, or a number of bits flipped in a column of the parity check matrix in a previous decoding iteration.

In some embodiments, a set of rules comprises a finite state machine (FSM).

In some embodiments, the FSM is configured to maximize a throughput of the bit-flipping decoder. FIG. 7 illustrated that orders of magnitude of reduction in the CFR of a bit-flipping decoder only translates to a tiny traffic reduction to the min-sum hard (MSH) decoder. Thus, embodiments of the disclosed technology focus on, amongst other features and benefits, improving the convergence of the bit-flipping decoder instead of simply reducing the traffic to the MSH decoder.

In some embodiments, flipping the at least one bit comprises flipping multiple bits in the single column. In an example, flipping multiple bits can improve the convergence speed.

In some embodiments, each stage of the plurality of stages corresponds to a predetermined number of clock cycles.

Typically, a single bit-flipping decoder iteration operates over several clock cycles (e.g., number of clock cycles, K>>1), and the bit-flipping threshold (amongst other parameters) is only updated after an iteration is completed, i.e., the decoder parameters are updated for the next multi clock cycle iteration if the iteration index has not exceeded the maximum number of iterations. Embodiments of the disclosed technology update the bit-flipping threshold after a predetermined number of clock cycles (e.g., K=1, 2, 5 and so on), which is configured to occur in the middle of an iteration.

In some embodiments, an index of the single decoding iteration is less than a maximum number of decoding iterations.

The use of LDPC codes in data storage systems are typically configured for operation at a signal-to-noise ratio (SNR) that is higher than the typical wireless channel. Consequently, the number of errors encountered in the received (or read) codeword are fewer than in the case of a wireless channel. Thus, embodiments of the disclosed technology are configured to perform LDPC bit-flipping decoding operations at time increments smaller than a complete iteration (e.g., per clock cycle or per a predetermined number of clock cycles), This ensures that if a codeword only has 1 or 2 bit errors, and they get corrected after processing the first few columns, then the remainder of the iteration is not be completed as in a conventional bit-flipping decoder because the checksum and syndrome is checked after each bit-flipping operation. This advantageously increases the decoder throughput and reduces power consumption.

The methods and algorithms described above (including methods 800 and 900) can be configured to update the syndrome at every clock cycle, which is applied to the flipping indicator (or energy) calculation after a certain number of cycles of processing delay. The methods can be further configured to update the flipping threshold at every single clock cycle (or after every predetermined number of clock cycles).

In some embodiments, different finite state machines (FSMs) can be used to update the threshold at different dock cycles. In an example, $FSM_1$ is used to update the threshold at a first dock cycle, and $FSM_2$ is used to update the threshold at a second dock cycle and so on. In another example, $FSM_1$ is used initially, $FSM_2$ is used after a first predetermined number of clock cycles, and $FSM_3$ is used for the last set of clock cycles. In yet another example, if a quasi-cyclic LDPC (QC-LDPC) code is being used, the FSMs can be configured based on properties of the circulant weights of the parity check matrix. The FSMs can be optimized to maximize the throughput of the bit-flipping decoder.

In an SSD, most of read commands (i.e., traffic) are processed by the BF decoder while the MS decoder only handles less than 5% of the traffic. The BF decoder is designed in the way so that the gate-count (GC) and power is minimized with worse error correction capability compared to the MS decoder.

As discussed above, BF decoders are a type of decoders where a flipping energy of a variable node is determined based on messages received from neighboring check nodes. The flipping energy is then compared to a threshold to decide if a variable node should be flipped (e.g., 815 of FIG. 8). A BF decoder works well for a regular code where row weights are the same and column weights are the same too. When the BF decoder is applied to an irregular code, its performance shows certain degradation depending on the irregularity of the irregular code. That is, the waterfall and error floor point of the BF decoder's CFR curve will suffer from a big loss comparing to its application in the regular code. Embodiments of the present invention provide a BF decoder and decoding method capable of working more effectively on irregular codes.

Inventors observed that one of the reasons that the BF decoder does not work well for the irregular code is that messages coming from different check nodes are treated equally when calculating the flipping energy. For example, the flipping energy of a variable node may be calculated as the following:

$$E(i)=\Sigma\{\forall j\ w/H(i,j)=1\}s\_old(j)+(dec\_prev(i)!=chn(i)).$$

Herein, "s_old" represents a syndrome and "dec_prev" represents a current value of a variable node, and "chn(i)" represents a channel output value. As can be seen from the equation associated with the flipping energy, there is no differentiation between a syndrom s_old coming from a weak check node and the a syndrom s_old coming from a stronger check node.

Embodiments may replace the flipping energy function E(i) previously discussed with the following:

$$E(i)=\Sigma\{\forall j\ w/H(i,j)=1\}w(j)^*s\_old(j)+(dec\_prev(i)!=chn(i)).$$

In order to make a BF decoder work well for irregular codes, embodiments may quantify a strength (or weight) of a check node first and use the weight to determine the flipping energy function E(i). That is, the replaced flipping energy function E(i) may be used for a decoding of the BF decoder, e.g., the operation 810 of FIG. 8.

As can be seen from the equation above, the new flipping energy function E(i) may be determined based on: a weight w(j) of at least one check node coupled to a single column of a parity check matrix; a syndrome s_old(j) as a product of the noisy codeword and the parity check matrix; and a hard decision value dec_prev(i)! of a previous iteration and a channel output value chn(i) associated with the column.

In some embodiments, the new flipping energy function E(i) may be computed based on a product of the weight w(j) and the syndrome s_old(j) and a logical operation of the hard decision value dec_prev(i)! and the channel output value chn(i). (dec_prev(i)!=chn(i)) represents an exclusive OR (XOR) of the hard decision value dec_prev(i)! the channel output value chn(i).

In some embodiments, in order to avoid overlow issue, the bitwidth of the new flipping energy function E(i) may be increased by several bits (e.g., 2 bits). The flipping threshold T in 815 of FIG. 8 may depend on the column weight of the variable node, and the threshold value may be trained with the dynamic range of the new flipping energy function E(i) and applied on the fly to decide if a flipping should be performed to a bit or not.

In order to make a BF decoder work well for irregular codes, embodiments may quantify a strength (or weight) of a check node first. The BF decoder of embodiments may use the following equation to indicate a weight of a check node, that is, a weight of a C2V message from a check node to a variable node:

$$w(j)=f(row\_weight(j), vn\_deg\_profile(j), iteration)$$

Herein, "row_weight(j)" represents a row weight of a check node, "vn_deg_profile(j)" represents a column weight profile of a variable node, "iteration" represents a number of decoding iterations. For example but not limited to, a column weight profile may include a high column weight=2, a medium column weight=1 and a low column weight=0.5. As can be seen from the equation, the weight function w(j)

may be determined based on a row weight of the check node row_weight(j), a column weight profile of the column vn_deg_profile(j) and a number of the decoding iteration. In some embodiments, a different set of values in the weight function w(j) may be used at different iterations.

In some embodiments, the weight function w(j) may be determined such that a higher weight may be assigned to a strong check node, i.e., C2V messages coming from the strong check node whereas a lower weight may be assigned to a weak check node, i.e., C2V messages coming from the weak check node. Herein, a strong check node represents a check node with high row weight and a weak check node represents a check node with low row weight. In some embodiments, the weight function w(j) may be implemented by a look-up table, and values thereof can be obtained by offline training.

In an embodiment, the weight function (j) may be determined as the following:

$$w(j)=3\{CN \text{ row weight}<60 \text{ and min } VN \text{ weight}>3\},$$

$$w(j)=2\{(CN \text{ row weight}\geq 60 \text{ and min } VN \text{ weight}\geq 3) \text{ or } (CN \text{ row weight}\leq 60 \text{ and min } VN \text{ weight}\leq 3)\}, \text{ and}$$

$$w(j)=1\{CN \text{ row weight}\geq 60 \text{ and connection to } low \text{ weight } VN\}.$$

Herein, "CN row weight" represents column row weight, "min VN weight" represents the minimum column weight of all the columns in a variable node zone, and "connection to low weight VN" represents the connection in the adjacent matrix of the parity check matrix, to a variable node with low weight. As can be seen from the equations above, the weight function w(j) may have a different value depending on one or more conditions. In case that two contitions satisfied, i.e., {CN row weight<60} and {min VN weight>3}, the weight function w(j) may be 3. In case that two contitions satisfied, i.e., {CN row weight≥60} and {connection to low weight VN}, the weight function w(j) may be 1. In case that one of two contitions satisfied, i.e., {(CN row weight≥60 and min VN weight≥3) or (CN row weight≤60 and min VN weight≤3)}, the eight function w(j) may be 2.

Figure 10:
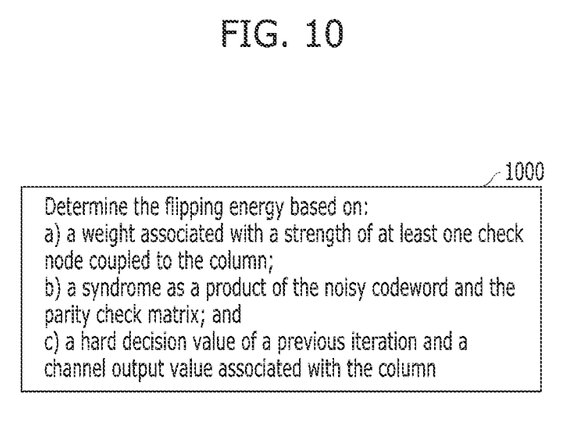
FIG. 10 is a flowchart illustrating a method for determining a flipping energy for a bit-flipping (BF) decoder in accordance with an embodiment of the present invention.

FIG. 10 is a flowchart illustrating a method 1000 for determining a flipping energy for a decoding system in accordance with an embodiment of the present invention. In an embodiment, the decoding system may include a processor (e.g., the control component 120 of FIG. 2) and a memory (e.g., the storage 110 of FIG. 2) including instructions stored thereupon. The instructions upon execution by the processor may cause a bit-flipping (BF) decoder (e.g., the decoder 600B of FIG. 6) to determine a flipping energy through the method 1000 of FIG. 10 and perform the decoding operation of FIGS. 8 to 9B based on the determined flipping energy.

Referring to FIG. 10, the flipping energy may be determined based on: a) a weight of at least one check node coupled to the column; b) a syndrome as a product of the noisy codeword and the parity check matrix; and c) a hard decision value of a previous iteration and a channel output value associated with the column.

In some embodiments, the flipping energy may be computed based on a product of the weight and the syndrome and a logical operation of the hard decision value and the channel output value. In some embodiments, the flipping energy may be computed based on an addition of the product and the logical operation. In some embodiments, the logical operation may include an exclusive OR (XOR) operation.

In some embodiments, the weight may have a higher value as the check node is strong.

In some embodiments, the weight may be determined based on a row weight of the check node and a column weight profile of the column. In some embodiments, the weight may be determined based on a row weight of the check node, a column weight profile of the column and a number of the decoding iteration.

As described above, embodiments provide a scheme for determining a flipping energy used in a bit-flipping decoder. This scheme allows the bit-flipping decoder to decode irregular codes with reduced degradation of performance.

Although the foregoing embodiments have been illustrated and described in some detail for purposes of clarity and understanding, the present invention is not limited to the details provided. There are many alternative ways of implementing the invention, as one skilled in the art will appreciate in light of the foregoing disclosure. The disclosed embodiments are thus illustrative, not restrictive. The present invention is intended to embrace all modifications and alternatives that fall within the scope of the claims. Furthermore, the embodiments may be combined to form additional embodiments.

What is claimed is:

1. A method of operating a bit-flipping decoder, comprising:
   receiving a signal comprising a noisy codeword transmitted over a noisy channel in a data storage system, the codeword having been generated based on a parity check matrix of a low-density parity-check (LDPC) code and provided to a communication channel of the data storage system prior to reception by the bit-flipping decoder; and
   performing a single decoding iteration on the received noisy codeword, the single decoding iteration spanning a plurality of stages,
   wherein, performing the single decoding iteration includes, for each of the plurality of stages:
   computing a flipping energy corresponding to a single column of the parity check matrix,
   flipping at least one bit in the single column upon a determination that the flipping energy exceeds a flipping threshold,
   computing, subsequent to the flipping, a syndrome as a product of the noisy codeword and the parity check matrix, and
   updating the flipping threshold upon a determination that the syndrome is not zero, wherein updating the flipping threshold for a first stage of the plurality of stages is based on a first set of rules, and wherein updating the flipping threshold for a second stage subsequent to the first stage is based on a second set of rules different from the first set of rules,
   wherein the flipping threshold is updated in a middle of the single decoding iteration and thereby increases a throughput of the bit-flipping decoder, and
   wherein the flipping energy is determined based on:
   a weight of at least one check node coupled to the column;
   a syndrome as a product of the noisy codeword and the parity check matrix; and
   a hard decision value of a previous iteration and a channel output value associated with the column.

2. The method of claim 1, wherein the flipping energy is computed based on a product of the weight and the syndrome and a logical operation of the hard decision value and the channel output value.

3. The method of claim 2, wherein the flipping energy is computed based on an addition of the product of the weight and the syndrome and the logical operation.

4. The method of claim 2, wherein the logical operation includes an exclusive OR (XOR) operation.

5. The method of claim 1, wherein the weight has a higher value as the check node is strong.

6. The method of claim 1, wherein the weight is determined based on a row weight of the check node and a column weight profile of the column.

7. The method of claim 1, wherein the weight is determined based on a row weight of the check node, a column weight profile of the column and a number of the decoding iteration.

8. The method of claim 1, wherein updating the flipping threshold is based on an index of the decoding iteration, a number of non-zero values in the syndrome, or a number of bits flipped in a column of the parity check matrix in a previous decoding iteration.

9. The method of claim 1, wherein one or both of the first set and the second set of rules comprises a finite state machine (FSM) to maximize a throughput of the bit-flipping decoder.

10. The method of claim 1, wherein flipping the at least one bit comprises flipping multiple bits in the single column,
   each stage of the plurality of stages corresponds to a predetermined number of clock cycles, and
   an index of the single decoding iteration is less than a maximum number of decoding iterations.

11. A decoding system comprising:
   a processor and a memory including instructions stored thereupon, wherein the instructions upon execution by the processor cause a bit-flipping decoder to:
   receive a signal comprising a noisy codeword transmitted over a noisy channel in a data storage system, the codeword having been generated based on a parity check matrix of a low-density parity-check (LDPC) code and provided to a communication channel of the data storage system prior to reception by the bit-flipping decoder; and
   perform a single decoding iteration on the received noisy codeword, the single decoding iteration spanning a plurality of stages,
   wherein, performing the single decoding iteration includes, for each of the plurality of stages:
   computing a flipping energy corresponding to a single column of the parity check matrix,
   flipping at least one bit in the single column upon a determination that the flipping energy exceeds a flipping threshold,
   computing, subsequent to the flipping, a syndrome as a product of the noisy codeword and the parity check matrix, and
   updating the flipping threshold upon a determination that the syndrome is not zero, wherein updating the flipping threshold for a first stage of the plurality of stages is based on a first set of rules, and wherein updating the flipping threshold for a second stage subsequent to the first stage is based on a second set of rules different from the first set of rules, and
   wherein the flipping threshold is updated in a middle of the single decoding iteration and thereby increases a throughput of the bit-flipping decoder, and
   wherein the flipping energy is determined based on:
   a weight of at least one check node coupled to the column;
   a syndrome as a product of the noisy codeword and the parity check matrix; and
   a hard decision value of a previous iteration and a channel output value associated with the column.

12. The system of claim 11, wherein the flipping energy is computed based on a product of the weight and the syndrome and a logical operation of the hard decision value and the channel output value.

13. The system of claim 12, wherein the flipping energy is computed based on an addition of the product of the weight and the syndrome and the logical operation.

14. The system of claim 12, wherein the logical operation includes an exclusive OR (XOR) operation.

15. The system of claim 11, wherein the weight has a higher value as the check node is strong.

16. The system of claim 11, wherein the weight is determined based on a row weight of the check node and a column weight profile of the column.

17. The system of claim 11, wherein the weight is determined based on a row weight of the check node, a column weight profile of the column and a number of the decoding iteration.

18. The system of claim 11, wherein updating the flipping threshold is based on an index of the decoding iteration, a number of non-zero values in the syndrome, or a number of bits flipped in a column of the parity check matrix in a previous decoding iteration.

19. The system of claim 11, wherein one or both of the first set and the second set of rules comprises a finite state machine (FSM) to maximize a throughput of the bit-flipping decoder.

20. The system of claim 11, wherein flipping the at least one bit comprises flipping multiple bits in the single column,
   each stage of the plurality of stages corresponds to a predetermined number of clock cycles, and
   an index of the single decoding iteration is less than a maximum number of decoding iterations.

\* \* \* \* \*